United States Patent [19]

Suzuki et al.

[11] Patent Number: 4,755,693

[45] Date of Patent: Jul. 5, 1988

[54] ECL LATCH CIRCUIT INSENSITIVE TO ALPHA RAY DISTURBANCES

[75] Inventors: Hirokazu Suzuki, Yamato; Takehiro Akiyama; Teruo Morita, both of Kawasaki, all of Japan

[73] Assignee: Fujitsu Limited, Kawasaki, Japan

[21] Appl. No.: 700,893

[22] Filed: Feb. 7, 1985

[30] Foreign Application Priority Data

Feb. 13, 1984 [JP] Japan ................. 59-022965

[51] Int. Cl.[4] ............... H03K 3/01; H03K 19/086
[52] U.S. Cl. ................. 307/296 R; 307/200 A; 307/443; 307/278; 307/308; 307/455
[58] Field of Search ............ 307/443, 278, 296 R, 307/272 R, 272 A, 491, 200 A, 455, 308, 289

[56] References Cited

U.S. PATENT DOCUMENTS 4,506,165  3/1985  Gulati et al. ............... 307/443
4,540,900  9/1985  Early et al. ............... 307/455

FOREIGN PATENT DOCUMENTS 2123234  1/1984  United Kingdom .

OTHER PUBLICATIONS

Patent Abstracts of Japan, vol. 4, No. 130, 12th Sep. 1980, p. 114 E 25; and JP-A-55-83333 (Takeda Riken Kogyo K.K.) 23-06-1980.

IBM Technical Disclosure Bulletin, vol. 24, No. 12, May 1982, New York, U.S.A.; D. B. Eardley, "Latch Circuit Insensitive to Disturb by Alpha Particles", pp. 6461-6462.

Primary Examiner—Stanley D. Miller
Assistant Examiner—Timothy P. Callahan
Attorney, Agent, or Firm—Staas & Halsey

[57] ABSTRACT

A latch circuit inputting and holding a write data including a data input terminal for receiving a write data signal and a feedback input terminal for receiving a feedback signal from an output terminal, the latch circuit through a feedback loop, wherein the output terminal of the latch circuit outputs the write data signal at a suitable timing. The latch circuit is operated such that a potential difference between a peak voltage of a logic amplitude and a reference voltage at the side at which the feedback signal is applied is set larger than a potential difference between the peak voltage of the logic amplitude and the reference voltage at the side at which the write data signal is applied.

6 Claims, 3 Drawing Sheets

ECL LATCH CIRCUIT INSENSITIVE TO ALPHA RAY DISTURBANCES

BACKGROUND OF THE INVENTION

The present invention relates to a latch circuit used as a register, for example, between a central processing unit (CPU) and a high-speed memory in a computer system.

The latch circuit according to the present invention is advantageous against external noise, especially alpha rays from a ceramic package of an integrated circuit (IC).

As is well know, alpha rays are radiated from IC ceramic packages; when these alpha rays strike the transistors which constitute the IC, spike noise is mainly generated from the collectors of the transistors in the form of a minus peak. This spike noise causes errors during logic operations of the latch circuit. Namely, when the latch circuit is maintained in a "hold mode" which has two states, i.e., a high level state and a low level state, in each of the output lines, the level which should be maintained high is changed to the low level by this spike noise, so that the changed level state is latched and is maintained.

There are, in general, two ways to solve this spike noise caused by the alpha rays. First, it is possible to increase the logic amplitude between the high level and the low level in the logic operation to an extent great enough to overcome the influence of spike noise. Second, it is possible to provide a capacitor in the latch circuit in order to eliminate the spike noise by charging up the minus peak voltage.

The former technique, however, results in a lower switching speed because of the longer time taken for the change between the high level and the low level. The latter technique also results in a slower speed, in this case, due to the longer time for charging and discharging of the capacitor.

SUMMARY OF THE INVENTION

The primary object of the present invention is to provide a latch circuit used as a register in a computer system.

Another object of the present invention is to provide a latch circuit with reduced susceptibility to external noise, especially, alpha rays from a ceramic package of an IC circuit.

In accordance with the present invention, there is provided a latch circuit for receiving write data applied thereto and for holding therein the received write data, which includes a data input terminal to which a write data signal is applied and a feedback input terminal for receiving a feedback signal from an output terminal thereof through a feedback loop.

The latch circuit is operated such that the potential difference between the peak voltage of a logic amplitude and a reference voltage at the side at which the feedback signal is applied is set larger than the potential difference between the peak voltage of the logic amplitude and the reference voltage at the side at which the write data signal is applied.

In accordance with the present invention, it is possible to reduce susceptibility to external noise, especially alpha rays from a ceramic package of an IC, thereby enabling reduction of frequency of errors in a computer system.

DESCRIPTION OF THE PREFERRED EMBODIMENTS

Figure 1:
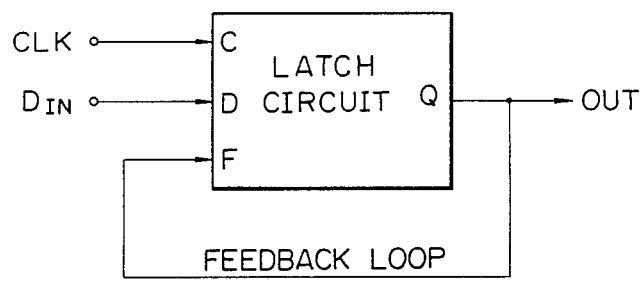
FIG. 1 is a basic block diagram of a latch circuit according to the present invention.

In FIG. 1, a latch circuit 1 is connected between a CPU (not shown) and a high-speed memory (not shown) and used as a register for data input or data hold from or to the CPU. The latch circuit 1 basically includes three input terminals, i.e., a first input terminal C for receiving a clock pulse (CLK) generated from a clock generator (not shown), a second input terminal D to which write data ($D_{IN}$) transmitted from the CPU is applied and a third input terminal F for a feedback loop. The latch circuit 1 also includes a terminal Q for outputting the write data held therein at a suitable timing. The feedback loop is provided between the terminal F and the terminal Q for the latch function.

Figure 2:
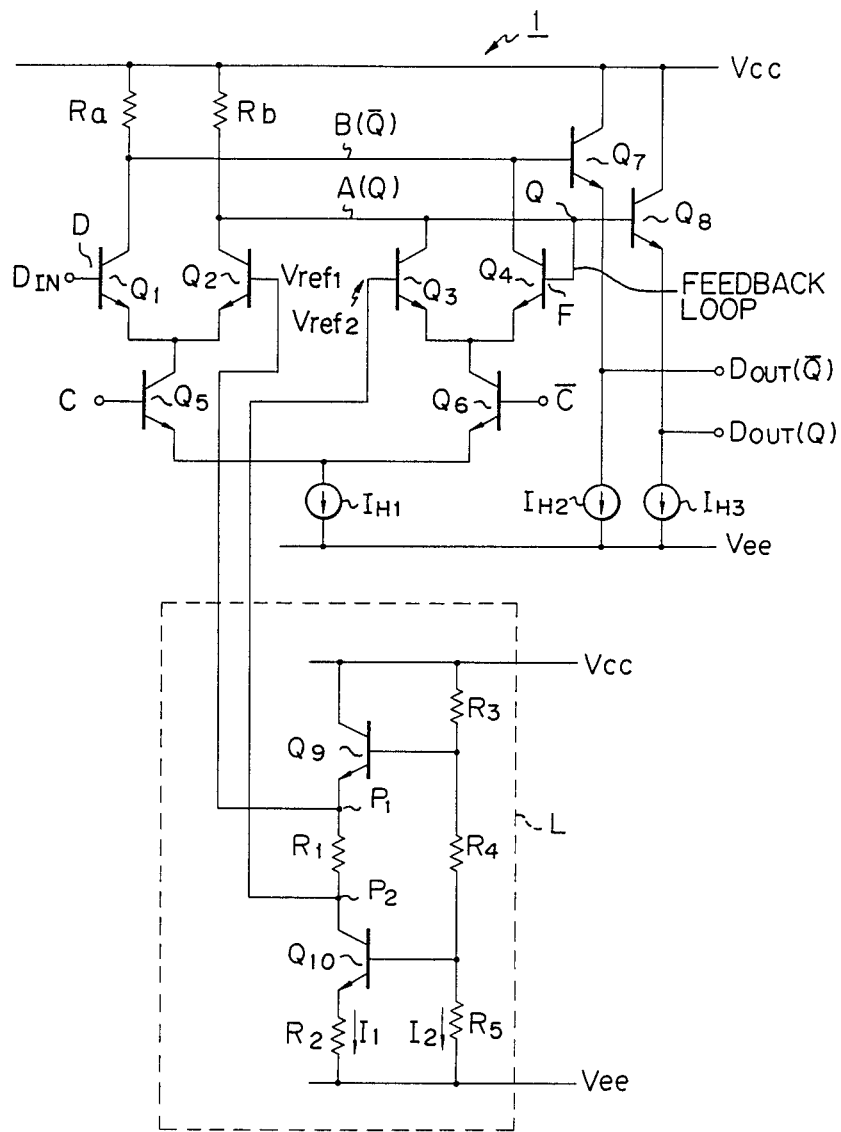
FIG. 2 is a circuit diagram of the latch circuit according to an embodiment of the present invention.

Referring to FIG. 2, the latch circuit 1 proper includes an emitter-coupled logic (ECL) circuit having a series gate structure which is constituted by three current switching circuits, i.e., a set of transistors $Q_1$ and $Q_2$ as a data input receiving section, a set of transistors $Q_3$ and $Q_4$ as a data holding section, and a set of transistors $Q_5$ and $Q_6$. Transistors $Q_7$ and $Q_8$ are used as output transistors, outputs of which are obtained from each emitter, i.e., are used as so-called emitter follower transistors. A resistor $R_a$ is connected between a common first power source $V_{cc}$ and the collector of the transistor $Q_1$, and a resistor $R_b$ is connected between the power source $V_{cc}$ and the collector of the transistor $Q_2$. Both resistors $R_a$ and $R_b$ are used as a load.

Moreover, reference numerals $I_{H1}$, $I_{H2}$, and $I_{H3}$ represent constant current sources with ends connected to a common second power source $V_{ee}$. The data input $D_{IN}$ is applied to the base of the transistor $Q_1$. When the clock pulse CLK is applied to terminal C connected to the base of the transistor $Q_5$, the output data $D_{OUT}(\overline{Q})$ is obtained from the emitter of the transistor $Q_7$ and the output data $D_{OUT}(Q)$ from the emitter of the transistor $Q_8$ as mentioned above. Two lines A and B represent complementary output lines. One output Q is on the line A and the other, inverted output $\overline{Q}$ is on the line B in this embodiment.

A circuit L indicated by the dotted line is a reference voltage setting circuit. This circuit L includes two transistors $Q_9$ and $Q_{10}$ and resistors $R_1$ to $R_5$. One reference voltage $V_{ref1}$ is obtained from the point $P_1$, the other reference voltage $V_{ref2}$ from the point $P_2$. The reference voltage $V_{ref1}$ is applied to the base of the transistor $Q_2$, and the reference voltage $V_{ref2}$ is applied to the base of the transistor $Q_3$.

The operation of these circuits will be explained in detail below.

In this circuit, there are two modes according to the clock signal C and inverted clock signal $\overline{C}$, i.e., an "input mode" and "hold mode". When the clock signal C is high level and $\overline{C}$ is low level, the transistor $Q_5$ is in the ON state and the transistor $Q_6$ is in the OFF state. Therefore, the constant current $I_{H1}$ is applied to the current switching circuit $Q_1$, $Q_2$ for receiving the write data $D_{IN}$, applied to the data input terminal O whereas the current switching circuit $Q_3$, $Q_4$ for hold function does not work because no current is applied. In the input mode, the write data $D_{IN}$ is written in the latch circuit 1 so that each output line $A(Q)$, $B(\overline{Q})$ becomes high level or low level according to the write data $D_{IN}$. For example, when the write data $D_{IN}$ is a higher level than the reference $V_{ref1}$, the transistor $Q_1$ enters the ON state and the transistor $Q_2$ enters the OFF state, so that the output line $A(Q)$ becomes high level and the $B(\overline{Q})$ low level.

After the write data input mode, according to the change of the clock signal C from the high level to low level and $\overline{C}$ from low to high, the transistor $Q_6$ enters the ON state and transistor $Q_5$ the OFF state, so that the current switching circuit $Q_3$, $Q_4$ becomes active due to the constant current $I_{H1}$. Consequently, since the output Q is fed back to a feedback input terminal F through the feedback loop, the input write data Q, $\overline{Q}$ (for example, Q is high and $\overline{Q}$ is low) at the output lines A, B are latched and held by the circuit $Q_3$, $Q_4$. This is the hold mode in which the current switching circuit composed of the transistors $Q_1$, $Q_2$ is not activated, so that even though the write data $D_{IN}$ is changed during the hold mode, there is no effect on the output line A, B.

Since the output line A is fed back to the feedback input terminal F for the latch function, the spike noise is applied to the output terminal A during the hold mode. Especially, since spike noise by alpha rays is negative noise, typically the high level is held at the output line A and the low level is held at the output line B.

The problem of the alpha rays is explained in the typical situation as follows.

Figure 3:
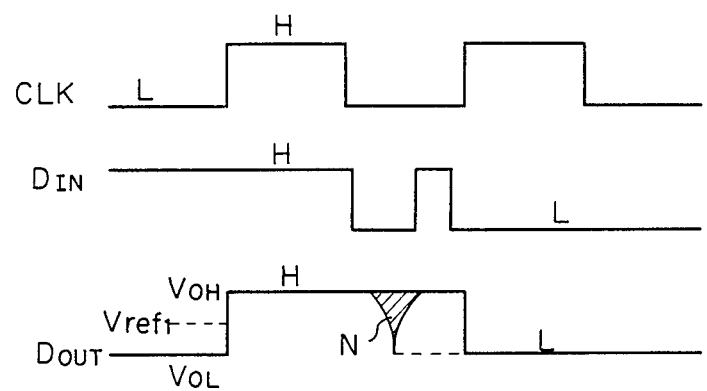
FIG. 3 is a timing chart of each signal of the circuit shown in FIG. 2.

When alpha rays are irradiated on the circuit, spike noise N (shown in FIGS. 3 and 4) having a minus peak is generated from each of the transistors. In the conventional circuit, in the hold mode at the typical situation, although the output line A should be maintained at the high level Q, the high level is changed to the low level by this spike noise, as shown by the dotted line in FIG. 3. This is because the reference voltage $V_{ref1}$ is set to the same level as the reference voltage $V_{ref1}$ at the medium level between the high level $V_{OH}$ as an upper peak voltage of a logic amplitude and the low level $V_{OL}$ as a lower peak voltage of a logic amplitude of the write data $D_{IN}$. Accordingly, when the peak level insert of the spike in the negative direction exceeds below the $V_{ref1}$ level, i.e., the change is so great as to decrease below the threshold level of the transistor, the high level $V_{OH}$ is undesirably changed to the low level so that the changed low level at the output line A is fed back to the current switching circuit of the transistors $Q_3$, $Q_4$, so that the changed low level Q is latched even after the alpha ray disappears.

Figure 4:
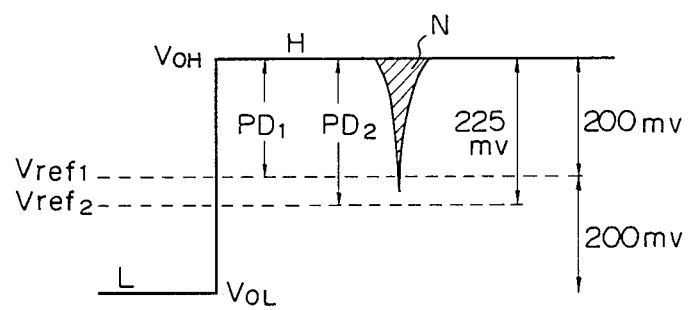
FIG. 4 is a chart explaining reference voltages according to the present invention.

According to the present invention, the reference voltage $V_{ref2}$ is set to a level lower than the reference voltage $V_{ref1}$ from the high level $V_{OH}$. This reference voltage $V_{ref2}$ is also set to a level lower than the minus peak level of the noise. Accordingly, even if the spike noise is generated, it does not exceed the reference voltage $V_{ref2}$ so that the high level $V_{OH}$ is not changed to the low level $V_{OL}$, as shown in FIG. 4.

That is, the noise margin of the high level of the feedback input terminal relatively to the reference $V_{ref2}$ is larger than that of the write data $D_{in}$ relatively to $V_{ref1}$. As explained above, the noise margin of the write data $D_{IN}$ relatively to $V_{ref1}$ should be determined according to the viewpoint of the logic speed. In other words, the noise margin of the write data is set to be minimum. In the present invention, the noise margin of the write data $D_{IN}$ is the same as the conventional one, while the noise margin of the high level of the feedback input F is set larger than the conventional one by making the $V_{ref2}$ lower than $V_{ref1}$.

In the reference voltage setting circuit, both reference voltages are obtained from the following formulas.

$V_{ref1} = R_3 \cdot I_2 + V_{BEQ9}$ $V_{ref2} = V_{ref1} + \Delta V_{ref}$ where, $\Delta V_{ref} = R_1 \cdot I_1$ In the conventional reference voltage setting circuit, there is no resistor $R_1$ between the transistor $Q_9$ and the transistor $Q_{10}$. Accordingly, as mentioned before, the reference voltage $V_{ref1}$ is set to the same level as the reference voltage $V_{ref2}$.

In FIG. 4, reference letters $PD_1$ and $PD_2$ represent the potential difference from the high level $V_{OH}$. The potential difference $PD_1$ is equal to the difference between the high level $V_{OH}$ and the reference voltage $V_{ref1}$, and the potential difference $PD_2$ is equal to the difference between the high level $V_{OH}$ and the reference voltage $V_{ref2}$.

Figure 5:
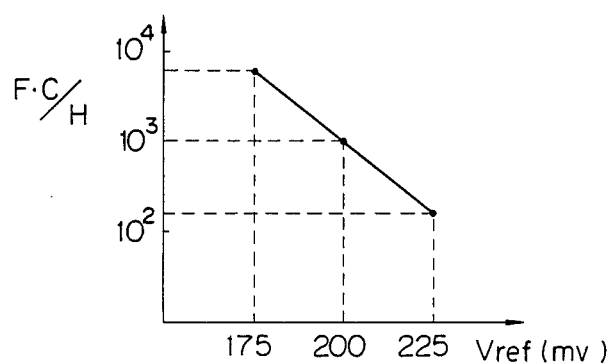
FIG. 5 is a graph explaining the effect of the present invention.

In FIG. 5, the ordinate represents the number of errors, i.e., failure counts (F.C) per one hour, and the abscissa represents the reference voltage level from the high level. When the potential difference $PD_2$ is about 175 (mV), the failure count is about $8 \times 10^3$ due to the spike noise, while, when the potential difference $PD_2$ is about 200 (mV), the failure count is about $10^3$. When the potential difference $PD_2$ is about 225 (mV), the failure count is about $2 \times 10^2$ — a considerable reduction. In this case, the logic amplitude between the high level $V_{OH}$ and the low level $V_{OL}$ is set to about 400 (mV). In general, since the minus peak level of the noise is about 180 to 200 mV, it is sufficient to set the potential difference $PD_2$, i.e., reference voltage $V_{ref2}$ level to about 225 (mV) so as to reduce error.

Further, when other external noise is added to the write data $D_{IN}$, that noise has no influence on the circuit when in the data input mode. This is because the high-level clock pulse is always applied to the base of the transistor $Q_5$ in the data input mode, so that if minus peak noise is added to the write data $D_{IN}$, the circuit can be immediately returned to the state according to the properly applied write data $D_{IN}$.

Moreover, according to the present invention, the reference voltage $V_{ref1}$ is set to the same level as the conventional circuit for maintaining the high-speed switching. This is because, if the noise margin against the reference voltage $V_{ref1}$ is set larger than the conventional level to obtain a sufficient noise margin, the switching time becomes too long and the switching speed falls to a level lower than that of a conventional circuit. Consequently, only the reference voltage $V_{ref2}$ is set lower than the reference voltage $V_{ref1}$ from the high level. Also, the output level $D_{OUT}$ of the latch circuit 1 is not changed from the conventional one so that there is no change from the external circuit to which the output $D_{OUT}$ is applied. Only the inside of the latch circuit 1 is changed, whereas the interface to the outside is not changed.

Further, as is obvious from the above explanation, when noise peaking in the positive direction caused by factors other than alpha rays, is applied to the output line B($\overline{Q}$) and the low level is changed to the high level in the hold mode, the reference voltage $V_{ref2}$ should be set higher than the reference voltage $V_{ref1}$ as measured from the low level $V_{OL}$.

We claim:

1. A latch circuit operative, alternately, in an input mode for receiving a write data signal applied thereto, and in a hold mode for holding a received write data signal and producing a corresponding write data output signal, comprising:

a data input terminal to which a write data signal is applied, the write data signal having first and second peak voltage levels defining the logic amplitude thereof;

reference voltage setting means for setting first and second reference voltages having respective first and second, different voltage levels;

an output data terminal;

write data receiving means operatively connected to said reference voltage setting means for receiving the first reference voltage level therefrom and to said data input and said data output terminals, said write data receiving means being opertive during the input mode for receiving a write data signal, as applied to said data input terminal, having a first peak voltage level greater than the first reference voltage level and producing a write data outut signal, corresponding to a received write data input signal, at said data output terminal;

data holding means having a feedback input terminal and a feedback loop connecting said feedback input terminal to said output data terminal, said write data holding means being operatively connected to said reference voltage setting means for receiving the second reference voltage therefrom and to said write data receiving means, and being operative during the holding mode for holding a write data signal received by said write data receiving means, said data holding means further being responsive to the write data output signal, as produced at the data output terminal and supplied through said feedback loop to said feedback input terminal thereof, having a first peak voltage level greater than the second reference voltage level for maintaining said corresponding write data output signal at the output data terminal; and said reference voltage setting means setting the first and second reference voltages so as to establish a potential difference between the first peak voltage of the logic amplitude of the write data signal, as received by the write data receiving means, and the first reference voltage which is smaller than the potential difference between the first peak voltage of the logic amplitude of the corresponding write data output signal, as supplied to the feedback input terminal of the data holding means, and the second reference voltage.

2. A latch circuit as recited in claim 1, wherein:

said write data receiving means comprises a current switch circuit comprising first and second transistors, each having collector, base and emitter terminals, connected to define alternatively selectable, parallel collector-emitter conducting paths and with one of the corresponding, respective said collector and emitter terminals connected to a first common junction;

said data holding means comprises a current switching circuit comprising third and fourth transistors, each having collector, base and emitter terminals, connected to define alternatively selectable, parallel collector-emitter conducting paths and with one of the corresponding, respective said collector and emitter terminals connected to a second common junction;

said data input terminal being connected to the base terminal of said first transistor, the second reference voltage being applied to the base terminal of the second transistor, the first reference voltage being applied to the base terminal of the third transistor, and said feedback input terminal being connected to the base terminal of said fourth transistor.

3. A latch circuit as recited in claim 2, further comprising:

fifth and sixth transitors, each having collector, emitter and base terminal, one of the corresponding, respective said collector and emitter terminals thereof being connected to a third common junction and the other of said collector and emitter terminals being connected to said first and second common junctions, respectively, so as to define alternately selectable, parallel collector-emitter conducting paths in series with the respective, alternately selectable collector-emitter conducting paths of said first and second transistors and of said thrid and fourth transistors, respectively; and complementary clock pulse input terminals respectively connected ot the base terminals of said fifth and sixth transistors.

4. A latch circuit as defined in claim 3, further comprising:

first and second emitter-follower output transistors each having collector, emitter and base terminals;

said output data terminal comprising complementary output terminals connected to the emitter terminals of respective said emitter-follower output transistors; and said base terminals of said emitter-follower output transistors being connected to the other of said corresponding collector and emitter terminals of the respective first and second transistors, with respect to the selected one of the corresponding and respective collector and emitter terminals thereof connected to said first common junction.

5. A latch circuit as recited in claim 1, wherein said reference voltage setting means comprises:

first and second reference voltage transistors each having at least collector and base terminals;

a resistor; and said collector-emitter current conducting path of said first and second reference voltage setting transistors being connected in series with said resistor therebetween; and said first and second reference voltages being produced at the connections of said resistor with the respective first and second reference voltage transistors.

6. A latch circuit operative, alternately, in an input mode for receiving a write data signal applied thereto, and in a hold mode for holding a received write data signal and maintaining a corresponding write data output signal, comprising:

a data input terminal to which a write data signal is applied;

a source of a first reference voltage and a source of a second reference voltage, the first reference voltage being larger than the second reference voltage;

a data receiving, current switching circuit comprising first and second transistors each having collector, base and emitter terminals, the base terminal of the first transistor being connected to the data input terminal and the base terminal of the second transistor being connected to the first reference voltage source;

a data holding, current switching circuit comprising third and fourth transistors each having corresponding base, collector and emitter terminals, the base terminal of the third transistor being connected to the second reference voltage source and further comprising a feedback loop connecting the base terminal of the fourth transistor to the collector terminal of the second transistor;

a power source comprising first and second voltage terminals having a predetermined potential differential therebetween;

said data receiving circuit and said data holding circuit further comprising first and seocnd common load elements, the first common load element being connected between the first power terminal and, in common, the collector terminals of the first and fourth transistors and the second common load element being connected between the first power terminal and, in common, the collector terminals of the second and third transistors;

fifth and sixth transistors each having base, emitter and collector terminals, the collector terminal of the fifth transistor being connected, in common, to the emitter terminals of the first and second transistors, the collector terminal of the sixth transistor being connected, in common, to the emitter terminals of the third and fourth transistors, and the emitter terminals of the fifth and sixth transistors being connected, in common, to the second power terminal; and clock signal and inverted clock signal input terminals, the clock signal input terminal being connected to the base terminal of the fifth transistor and the inverted clock signal input terminal being connected to the base terminal of the sixth transistor.

* * * * *

UNITED STATES PATENT AND TRADEMARK OFFICE
CERTIFICATE OF CORRECTION

PATENT NO. : 4,755,693

DATED : July 5, 1988

INVENTOR(S) : Suzuki et al.

It is certified that error appears in the above-identified patent and that said Letters Patent is hereby corrected as shown below:

Front Page, [57] Abstract, line 3, after "signal" insert --,--;

line 4, "terminal," should be --terminal of--.

Col. 3, line 5, "O" should be --D--;
line 14, "B(Q]" should be --B($\overline{Q}$)--;
line 32, "terminal A" should be --line A--;
line 50, delete "insert";
line 51, change "exceeds" to --extends--;
line 64, change "is generated" to --occurs--, and change "exceed" to --extend below--.

Col. 6, line 22, "terminal" should be --terminals--;
line 32, "Thrid" should be --third--.

Col. 8, line 2, "seocnd" should be --second--.

Signed and Sealed this

Fourth Day of April, 1989

Attest:

DONALD J. QUIGG

*Attesting Officer*          *Commissioner of Patents and Trademarks*